United States Patent [19]

House

[11] 4,127,840
[45] Nov. 28, 1978

[54] SOLID STATE FORCE TRANSDUCER

[75] Inventor: J. Hardy House, Yorba Linda, Calif.

[73] Assignee: Conrac Corporation, Stamford, Conn.

[21] Appl. No.: 770,596

[22] Filed: Feb. 22, 1977

[51] Int. Cl.² .............................................. G01L 1/22
[52] U.S. Cl. ........................................ 338/4; 73/727;
338/42; 357/26; 357/67
[58] Field of Search .................. 338/4, 5, 42; 357/26,
357/65, 67, 4; 73/88.5 SD, 398 AR, 721, 727;
427/125, 123, 124

[56] References Cited
U.S. PATENT DOCUMENTS

| | | | |
|---|---|---|---|
| 3,274,670 | 9/1966 | Lepselter | 357/67 X |
| 3,739,315 | 6/1973 | Kurtz et al. | 338/4 |
| 3,916,365 | 10/1975 | Giachino | 338/5 X |

*Primary Examiner*—C. L. Albritton

[57] ABSTRACT

The limited temperature range for operation of conventional semiconductive force transducers is greatly extended in both directions, typically attaining a range from about 4° Kelvin to at least about 400° C. A piezoresistive strain gage is typically formed in a monocrystalline layer of semiconductive material grown epitaxially to a thickness of only a few microns on a monocrystalline support member which has high inherent resistivity and serves directly as force responsive member. For example, silicon is grown epitaxially on one face of a sapphire pressure responsive diaphragm with suitably oriented crystal axes. The diaphragm is typically mounted in hermetically sealed relation on an alumina support with an interlayer of fused glass having selected properties. Transition from the alumina support to a conventional housing is preferably made via a metal such as Kovar in described configuration. Electrical connections to the silicon capable of withstanding high temperatures are preferably made via platinum with a shield of silicon/platinum alloy.

12 Claims, 4 Drawing Figures

U.S. Patent  Nov. 28, 1978  4,127,840
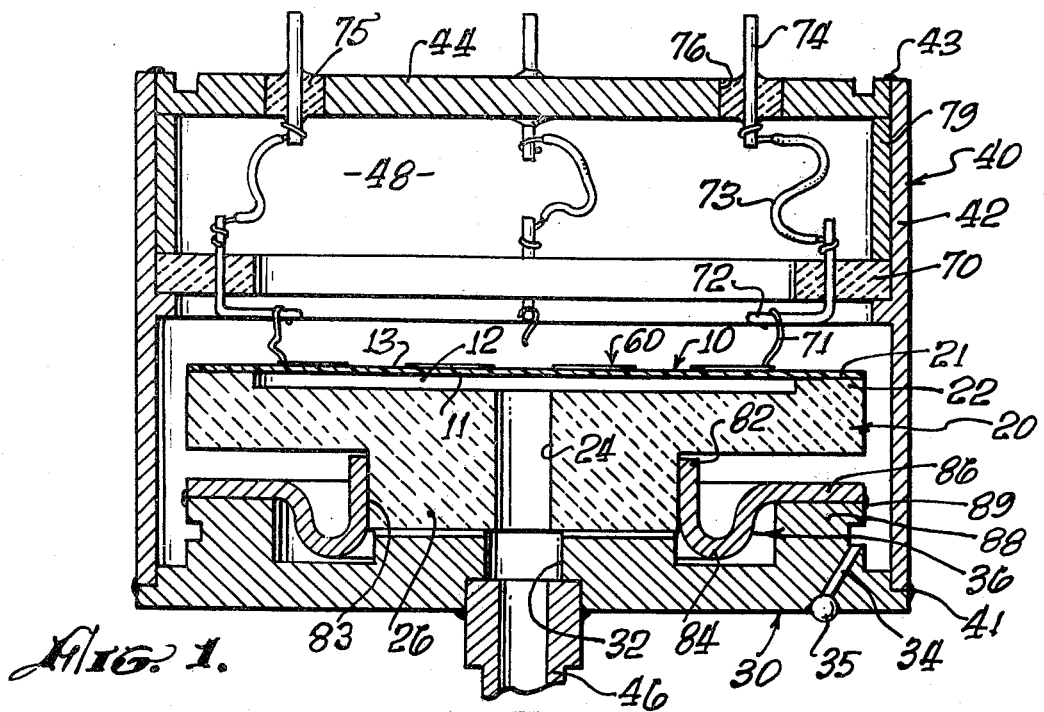
Fig. 1.
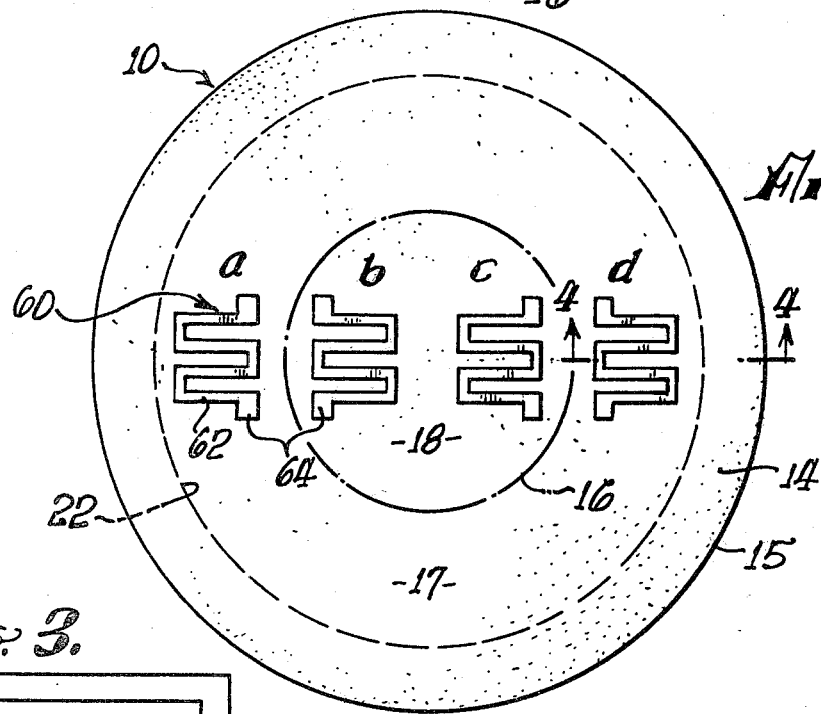
Fig. 2.
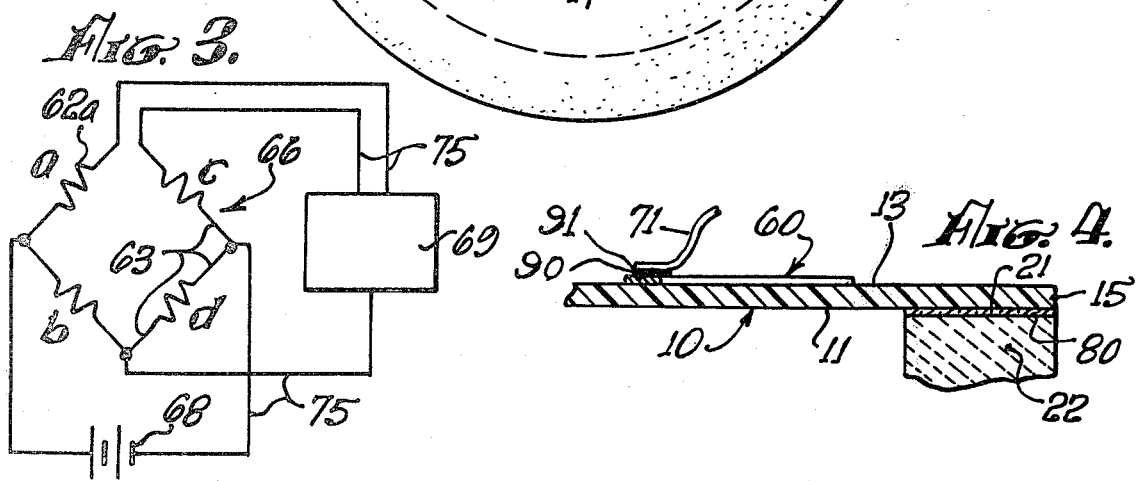
Fig. 3.
Fig. 4.

SOLID STATE FORCE TRANSDUCER

BACKGROUND OF THE INVENTION

This invention relates generally to solid state force transducers in which a piezoresistive strain gage of semiconductive material is formed directly on a face of a force responsive member. For clarity, the invention will be described primarily as it relates to pressure transducers.

The patent literature describes many force transducers in which the force to be measured is applied to a single crystal of silicon, and the piezoresistive strain gage is formed by diffusing suitable impurities into selected areas of a face of the silicon crystal to alter the conductivity type of the silicon. The PN junction between the treated and untreated areas of the silicon crystal can then be reverse biased by applying suitable voltage to the strain gage, normally providing effective electrical insulation between the resistive elements of the gage and the surrounding silicon crystal.

However, since the breakdown voltage of a PN junction decreases progressively with increasing temperature, transducers depending for insulation upon such a reverse biased PN junction are inherently limited to operation at moderate temperatures. At room temperature the reverse leakage current is typically in the microampere range, and the breakdown voltage of the junction is typically from 100 to 120 volts. There is then an ample margin if the piezoresistive gage is operated at a moderate voltage such as 12 volts, for example. That margin decreases relatively slowly with increasing temperature up to about 80° C. Above that temperature, however, the breakdown voltage decreases at a rapidly increasing rate, accompanied by increasing current leakage across the reverse biased PN junction. The maximum temperature for reliable and efficient operation is usually considered to be about 150° C.

Prior art force transducers of the described type are also limited in operating temperature due to difficulties in mounting the silicon diaphragm or other force responsive element on a rigid support. No fully satisfactory procedure is available for bonding silicon to a support of stainless steel or the like in a manner which fully isolates the silicon from stresses due to temperature variations. Moreover, commonly used bonding materials, such as epoxides and soft solders, lose their beneficial properties at extreme temperatures. Thus, adhesives tend to melt or burn above about 200° C. and to become so brittle as to lose all adhesion below about −60° C. That problem is especially severe in the case of pressure transducers, since sealing materials tend to become porous or otherwise fail to maintain a hermetic seal at temperatures beyond approximately the same limits, permitting leakage around the pressure sensing diaphragm.

Some of those limitations in mounting pressure diaphragms are overcome to a considerable extent by the technique described in U.S. Pat. No. 3,417,361, which is assigned to the same assignee as the present application. In that technique the silicon diaphragm and its support structure essentially constitute portions of a unitary single crystal which encloses the pressure chamber. Pressure transducers made by that technique are capable of giving excellent results at conventional operating temperatures, fully justifying the additional care and expense required. However, they are still subject to temperature limitations due both to their dependence upon PN junctions for insulation and to the need for obtaining a hermetic seal between the silicon cell and the support hardware.

The temperature range of operation of conventional silicon force transducers may also be limited by the manner of connecting electrical leads to the silicon for bringing current to and from the strain gage. For example, many of the best silicon strain gages employ gold wires bonded to the silicon either directly or with a barrier layer such as nickel. Although such connections are highly satisfactory throughout the temperature range in which the gage itself can operate, the gold-silicon bond tends to fail above 360° C., which is the eutectic temperature of those materials.

OUTLINE OF THE INVENTION

A primary object of the present invention is to provide semiconductive transducers having electrical response properties generally similar to those of the unitary piezoresistive silicon gages just described, but without the temperature limitations of the previously available transducers. The present invention typically provides pressure transducers, for example, that operate satisfactorily at temperatures from about 4° Kelvin up to at least about 400° C., and provides other types of force transducers that are operative at even higher temperatures.

A more particular object of the invention is to provide a semiconductive silicon strain gage, in the form of a thin layer of silicon of selected configuration, molecularly integrated directly with a substrate body which serves both as force collecting member and as inherent insulation for the semiconductive strain gage itself. In preferred form of that aspect of the invention, the substrate is such that the intimate combination of strain gage and substrate is capable of operating effectively over an abnormally great temperature range. The latter result is attained in part by the elimination of any intermediate bonding materials, other than the silicon and the substrate themselves, thereby eliminating the hysteresis that is normally generated due to differences of temperature coefficients of expansion of the various materials. Also, the silicon of the strain gage preferably forms so thin a layer on the substrate that it can follow movements of the substrate without development of appreciable bonding stresses.

A further object of the invention is to provide between the silicon of a strain gage and a support of stainless steel or the like a suitable mechanical transition that retains effective mechanical strength and hermeticity over a wide range of temperature, typically from about 4° Kelvin up to at least about 400° C., and effectively isolates the strain gage from irregular stresses throughout the described temperature range.

The invention further provides a novel procedure for attaching electrical leads to a silicon surface in a manner which will withstand temperatures appreciably higher than the above described conventional limit of 360° C.

Those and other objectives of the invention are accomplished by carefully integrating several diverse but related factors. A basic aspect of the invention concerns the force responsive member itself and its relation to the strain gage. The invention discards the PN junction as a means of electrical insulation, while retaining the advantages previously provided by formation of the piezoresistive elements directly in a thin surface layer of the pressure responsive member.

The force responsive member of the present invention has a flat working surface and comprises, at least in the vicinity of that surface, a single crystal of a material which has inherently a high dielectric constant, and thus is a good electrical insulator. That crystalline material is also selected to have a crystal lattice of such symmetry and scale that a suitably oriented face of the crystal provides a substrate on which a suitable crystalline semiconductive material can be epitaxially grown. An illustrative and preferred example of such substrate material is $Al_2O_3$, which forms rhombic single crystals commonly known as sapphire. When cut on the C axis, such crystals present a 1$\overline{1}$02 face which has cubic symmetry. It is well known that silicon, for example, can be deposited epitaxially on that face to form a single crystal, which then has a 100 crystal plane parallel to the face of the substrate.

Whereas the particular combination of sapphire substrate and silicon semiconductive sensor is preferred for carrying out the invention, other semiconductors having suitable piezoresistive properties, such as germanium, for example, may be used in combination with substantially any highly insulative crystalline substrates on which they may be grown epitaxially. For clarity of description, the invention will be described primarily as it relates to silicon and sapphire.

In preferred form of the present invention, silicon of a selected conductivity type is grown epitaxially on a single crystal diaphragm of such material, typically to a thickness of several microns. The desired strain gage configuration is produced in that silicon film by differential treatment of selected areas to alter the physical or chemical properties in such a way that those portions of the silicon film external to the desired strain gage can be selectively removed. For example, a protective mask may be applied over the desired gage area, as by a conventional photoresist process, permitting the unwanted surrounding silicon to be removed by etching.

In accordance with a preferred aspect of the invention, the initial silicon layer is grown epitaxially with suitable dopants to produce positive silicon. The area surrounding the desired strain gage is then selectively converted to negative conductivity type and the surround is then removed by selective electrolysis, leaving a strain gage of positive silicon. If desired, selected gage elements or the whole of the resulting positive strain gage area can then be converted to negative conductivity type. A particular advantage of the invention is thus the possibility of producing a strain gage which comprises elements of both positive and negative type, mounted upon a common surface of a force responsive member.

Whatever the detailed procedure, the remaining silicon typically constitutes a single crystal strain gage directly united with the substrate and physically isolated from everything except the substrate. The high dielectric constant of the selected substrate is not affected by temperature variations even well above 400° C. and down substantially to absolute zero, and the gage retains its excellent insulation throughout that temperature range. Although the coefficients of thermal expansion of silicon and sapphire are quite different, the silicon film is so thin, typically of the order of 5 microns, that it moves with the sapphire and generates only negligible stress in response to temperature variations.

Transducers of the described construction may employ strain gage configurations of any desired design. The strain gage typically comprises four distinct resistance elements which are connected to form a Wheatstone bridge or similar configuration, with opposite pairs of elements so oriented on the substrate member that their resistance values are oppositely altered by application of the stress to be measured. Electrical connections to the bridge elements are typically formed as silicon film areas to which wire leads may be joined in any suitable manner. The four elements may be interconnected in unitary manner by portions of the same single crystal configuration; or, if relatively widely separated on the substrate surface, may be interconnected by conductors of any suitable type.

A further aspect of the invention provides satisfactory support structure for the combination of diaphragm or other strain sensing member and the integrated silicon strain gage. Such support for a diaphragm preferably provides a hermetic seal between diaphragm and support, while insuring that even wide temperature variations do not significantly stress the diaphragm or degrade the hermetic properties of the seal.

In preferred form, the mounting structure of the invention employs at least two primary transitions of material. First, the force responsive member, typically comprising a single crystal of essentially pure $Al_2O_3$ carrying the silicon strain gage, is bonded to an effectively rigid support of ceramic. The latter may comprise alumina, a form of $Al_2O_3$, typically of approximately 98% purity. The thermal expansion coefficient of alumina is virtually identical to the value for sapphire on the C axis.

When mounting a pressure responsive diaphragm, the ceramic support is typically of shallow cup shape with a flat rim which can be bonded to one face of the diaphragm, enclosing a pressure chamber. The bond between the ceramic and sapphire is typically formed by melting a glass frit which is formulated to have a closely matching thermal expansion coefficient and a melting point exceeding 800° C. by sufficient margin to permit heating to approximately that temperature during later processing without affecting the bond. The resulting bond inherently forms a hermetic seal and can be cycled over a temperature range from about 4° Kelvin to at least 400° C. without significantly stressing the diaphragm normal to its plane.

The second stage of the preferred mounting structure of the invention employs a metallic transition member having a thin walled tubular portion and having a thermal expansion coefficient exceeding that of alumina, at least for the overall range between normal temperature and the treatment temperature for bonding the ceramic and transition member. The alumina or other ceramic support is formed with a base portion of sturdy proportions and having an external cylindrical mounting surface that fits within the tubular transition member with moderate clearance, such as 0.020 inch, for example. That alumina mounting surface is metallized in conventional manner by a suitable metal alloy having a melting temperature of the order of 1200° C.

The metallized support base and the inner wall of the transition member are then bonded together, preferably with pure silver. On cooling, the alumina is subjected only to compressive stress, against which it has a very high tensile strength. The inherent malleability of the silver bond relieves sharp stress risers, insuring a hermetic seal. A preferred illustrative material for the transition element is the known alloy sold commercially by Westinghouse under the trademark Kovar, which has a high nickel content and a suitable thermal expansion coefficient. The Kovar transition member is compatible with such materials as stainless steel, to which it can be brazed or welded, for example. Thus, stainless steel and Kovar can be employed for a housing and for conducting fluid to the pressure chamber.

A further aspect of the present invention provides a method of connecting electrical wires to the silicon resistive elements in a manner that is stable throughout the described temperature range from about 4° K. to about 400° C. For that purpose, platinum is first alloyed to about 700° C. to the silicon of the connection pads, forming an alloy of platinum silicide. Pure platinum is then deposited over that surface. Finally, platinum leads are bonded to the pure platinum, typically by thermocompression. The resulting junction is essentially ohmic in electrical nature, and withstands temperatures approaching the platinum/silicon eutectic point of about 700° C.

The present invention is useful in connection with piezoresistive force transducers for measuring widely varying kinds of forces, such as may be applied to force responsive members having any desired configuration, such as beams, plates, rods and the like. However, the advantages provided by the invention are especially striking in the case of fluid pressure transducers which employ a flexible diaphragm as force responsive member. For the sake of clarity and definiteness the invention will therefore be described primarily with reference to pressure transducers. Applicability of the invention to other forms of transducers will then be evident without detailed explanation.

BRIEF DESCRIPTION OF THE DRAWING

A full understanding of the invention, and of its further objects and advantages, will be had from the following description of illustrative manners of carrying it out. That description is to be read with reference to the accompanying drawing, in which FIG. 1 is an axial section representing an illustrative force transducer embodying the invention;

FIG. 2 is a schematic plan representing an illustrative strain gage on the diaphragm of FIG. 1;

FIG. 3 is a schematic diagram representing illustrative electrical circuit connections for carrying out the invention; and FIG. 4 is a fragmentary section corresponding to a portion of FIG. 1 at greatly enlarged scale.

DESCRIPTION OF PREFERRED EMBODIMENT OF THE INVENTION

FIG. 1 represents an illustrative force transducer in which the force responsive member comprises the circular pressure responsive diaphragm 10. That diaphragm is rigidly mounted at its periphery with a hermetic seal on the flat axial face 21 of the flange 22 of the circular support member 20, forming the pressure chamber 12 between the diaphragm and its support. Support member 20 is mounted in turn on the circular base 30 by means of the mounting ring 36, which is hermetically sealed to both the support member and the base in a manner to be more fully described. The instrument housing 40 may have any desired form, typically using base 30 as housing base and further comprising the cylindrical side wall 42 and the circular cover 44. Those parts are assembled in hermetically sealed relation at 41 and 43, as by conventional TIG welds, using tungsten electrodes with shielding by inert gas.

The fluid pressure to be sensed by diaphragm 10 is supplied to pressure chamber 12 and the lower face 11 of the diaphragm from the supply tube 46 via the central passage 32 in base 30 and the axial bore 24 in support member 20. The orientation of the instrument is immaterial to its operation, but will be assumed as shown in FIG. 1 for convenience of description. The upper face 13 of diaphragm 10 is exposed to the reference pressure in the chamber 48. That reference chamber includes the main body of housing 40, and is preferably evacuated through the passage 34 in base 30. That passage is then sealed in conventional manner at 35. The reference pressure is thus established as absolute zero, and is not affected by temperature variations.

Diaphragm 10 carries on its upper face 13 the semiconductive, piezoresistive sensor 60, comprising a thin layer of silicon of selected conductivity type with a suitable configuration when viewed in plan. Many available configurations have been described which take suitable account of the direction and sense of the stresses produced in a flexible diaphragm in response to differential pressure, and also take account of the resistance changes produced by such stresses in crystalline silicon for given conductivity type, crystal orientation and direction of current flow. The present invention is capable of utilizing virtually any such sensor configuration that is otherwise suitable. The typical configuration shown schematically in FIG. 2 is merely illustrative.

The rigidly anchored portion of diaphragm 10 is indicated at 14, typically coinciding in area with support face 21 of flange 22. The circle 16 represents schematically the locus of zero radial stress between the outer and inner diaphragm zones 17 and 18 in which the stresses due to pressure have opposite signs. Sensor 60 typically comprises the four resistive elements 62, all parallel to a selected crystal axis and uniformly oriented with respect to the diaphragm stress. Elements $a$ and $d$ are in outer zone 17, elements $b$ and $c$ in inner zone 18. Those resistive elements are connected electrically to form the typical Wheatstone bridge 66 of FIG. 3, as by fine wires indicated at 63 in FIG. 3 but omitted in FIG. 2 for clarity of illustration. The battery 68 represents any suitable means for supplying direct current to two opposite junctions of the bridge, and the numeral 69 designates conventional output circuit means for detecting and utilizing the resulting potential difference between the other two junctions. The resistances are so arranged that opposite bridge arms are subject to stresses of the same sign, producing additive responses. The electrical connections 77 between bridge 66 and the input and output circuits typically comprise the fine wires 71, the internal connecting pins 72, which are set in the insulative support ring 70 of FIG. 1, the flexible wires 73 and the external terminals 74, which are set in glass seals 75 in apertures 76 of housing cover 44. Ring 70 is typically positioned in the housing by the integral inner flange 78 and the spacer ring 79.

An important aspect of the invention concerns the structure and composition of diaphragm 10 and of semiconductive sensor 60. Diaphragm 10 typically comprises a single crystal of a material which has inherently a high dielectric constant and which has a crystal lattice of such symmetry and scale that it can provide a substrate for epitaxial growth of crystalline silicon. In the present illustration, diaphragm 10 will be considered to comprise a single crystal of aluminum oxide ($Al_2O_3$), generally referred to as sapphire, which has been cut with the plane of the diaphragm on the C axis. The thermal coefficient of expansion of sapphire in that plane is $70 \times 10^{-7}$ per ° C.

Sensor 60, shown fragmentarily at enlarged scale in FIG. 4, comprises monocrystalline silicon formations 62 molecularly integrated with face 13 of the sapphire diaphragm. A single crystal of silicon is typically first grown on the polished and cleaned cubic surface of the synthetic crystalline $Al_2O_3$ in a conventional epitaxial reactor, with heating by a radio frequency field to a temperature close to the melting point 1453° C. of silicon. The silicon is supplied as a gaseous compound of silicon and hydrogen in a carrier hydrogen atmosphere, together with suitable dopants in relative concentration to produce the desired conductivity type. The silicon is deposited essentially one atom at a time, assuming a crystal orientation determined by the sapphire substrate. The resulting silicon is intimately bonded to the crystalline substrate in a manner referred to herein as molecular integration.

Removal of portions of the resulting crystalline silicon layer to produce the desired strain gage configuration may be accomplished by a wide variety of procedures, including some already familiar in the preparation of conventional semiconductive strain gages which rely upon PN junctions for insulation from a silicon base. However, the distinctive chemical and physical properties of the substrates used in the present invention, which are crystals of high dielectric constant, permits greater freedom of manipulation. A preferred procedure includes production of an initial layer of positive silicon by epitaxial growth, and conversion of the unwanted portions of that layer to negative silicon by conventional selective deposition of suitable dopants in the area surrounding the desired pattern. The surround is then removed by conventional electrolysis in an alkaline bath, which etches negative silicon at a higher rate than positive.

The silicon layer may be made virtually as thin as desired, tending to increase the accuracy and convenience of such selective etching. The lower limit for the strain gage thickness is usually set by the desired electrical properties of the finished gage, thus varying considerably with the gage configuration. In general, effective results are obtainable with a thickness from about 2 to about 10 microns, or as high as the silicon layer remains monocrystalline. The presently preferred thickness is close to 5 microns.

The individual resistive elements of the strain gage structure, even if physically separated from each other as in the illustrative configuration 60 of FIG. 2, typically have uniform crystal structure and orientation, effectively comprising spaced sections of a single crystal. The individual resistive elements of the gage, and also the parallel sections of each resistive element are laterally isolated electrically from each other by open areas of the sapphire surface that are clear of silicon. Since the sapphire substrate is inherently an excellent insulator, the entire bridge configuration is reliably insulated.

The present sensor structure is thus clearly distinct from conventional structures in which the diaphragm itself is made of silicon and the silicon resistive elements of the sensor are insulated from the body of the diaphragm only by PN junctions associated with a difference of conductivity type. The present structure has the great advantage that the insulation of the semiconductive sensor remains fully effective up to temperatures well over 1,000° C.

In preferred form of the invention, support member 20 comprises a unitary body of a non-porous ceramic having a high thermal expansion closely similar to that of force responsive member 10. A particularly satisfactory material for support member 20 consists essentially of amorphous aluminum oxide. A commonly available form of aluminum oxide, which is generally known as alumina and typically has a purity of about 98%, can be accurately shaped by machining and the like when green, and is then fired at high temperature to produce an impervious ceramic which is very hard and is strong in compression. Another illustrative type of ceramic comprises aluminum oxide together with aluminum borosilicate and other added components, and has the advantage of being readily machinable after firing. That material is available commercially from Dow Corning Corporation under the trade name "Macor." Ceramic materials of that general type have thermal coefficients of expansion of about $70 \times 10^{-7}$ per ° C., matching closely the value for sapphire.

Ceramic support 20 and sapphire diaphragm 10 are mutually bonded by the thin sealing layer 80. That layer typically comprises a glass frit which is specially formulated to have a melting point between about 800° and about 840° C., for reasons to be described, and to provide in the solid state a thermal expansion coefficient close to that of sapphire. The nearly perfect match between the expansion coefficients of the three materials at the bond then effectively protects the diaphragm from stresses due to temperature variations. Moreover, in contrast to conventionally used adhesive materials, the glass bond continues to provide a hermetic seal at all temperatures below its softening point.

A further aspect of the invention provides a structure for mounting ceramic support member 20 in a fully hermetic manner on circular base 30, which is typically of stainless steel or similar material. That mounting structure must be compatible with the relatively brittle physical nature of ceramic support 20, must accommodate the high temperatures used during fabrication, and must retain hermeticity throughout the desired wide temperature range of operation of the completed transducer.

As typically shown, ceramic support 20 is formed with the sturdy coaxial mounting boss 26, which is embraced and supported by the tubular portion 82 of mounting ring 36. That ring is formed of light sheet metal and includes, in addition to tubular portion 82, the intermediate flexure portion 84 of general S-section and the outer mounting portion 86 of flat annular form, which is hermetically joined to the upstanding flange 88 of base 30, typically by the continuous TIG weld 89.

The hermetic bond at 83 between ceramic boss 26 and the surrounding tubular ring portion 82 preferably comprises substantially pure silver. That silver bond is made relatively thick, typically of the order of 20 mils, by suitable dimensioning of the parts. The high malleability of the silver then cushions slight irregularities of the mating surfaces and accommodates differential expansion with temperature both during fabrication and during normal operation. The cylindrical surface of ceramic boss 26 is first metallized in the seal area in known manner, as by painting on a suspension of molybdenum and manganese and firing. A silver wire is then introduced between the metallized surface and ring 36 and the assembly is heated in an inert atmosphere to melt the silver, nominally at 856° C., forming the desired hermetic bond. That bond is not disturbed when diaphragm 10 with its integrated semiconductive strain gage is later mounted on support 20, since the glass used for the latter connection melts at a lower temperature, as already described.

A particularly satisfactory material for mounting ring 36 is the high nickel ferrous alloy which is available commercially as "Kovar," a trademark of Westinghouse. That alloy has an expansion coefficient which is less than that of ceramics such as alumina at normal temperatures, but increases non-linearly with temperature, exceeding that of alumina by a rapidly growing margin in the range above a few hundred degrees. Kovar thus expands overall appreciably more than the ceramic between room temperature and 850° C. Hence the ceramic support member and the Kovar ring can be cooled after melting the silver bead between them with assurance that the primary stress on the ceramic will be compressive, against which it has high strength and stiffness.

Electrical connections to the elements of silicon strain gage 60 are freed from the usual temperature limitations by use of pure platinum wire at 71 in the immediate vicinity of the silicon. Each of the silicon connection pads, such as 64 of FIG. 2, is first coated with platinum, as by conventional sputtering in an oxygen-free atmosphere, typically to a depth of the order of a tenth of a mil. That limited amount of platinum is then alloyed to the silicon by heating to about 700° C., forming a layer of platinum silicide 90. A second film 91 of pure platinum is then deposited over that surface, and platinum leads are bonded to the resulting pure platinum surface, as by thermocompression. The alloy barrier 90 protects that bond from reaction with silicon at temperatures well above 400° C., providing the desired operating range for the strain gage.

The invention thus provides a semiconductive force transducer structure capable of effective and accurate operation throughout a temperature range from about 4° K. to at least about 400° C. That is accomplished by selective integration of several novel structural features, each of which extends the usual operating range for that portion of the overall assembly, thereby affording independent utility in addition to the highly significant collective utility of the overall combination.

I claim:

1. Force transducer comprising a single crystal of aluminum oxide having a crystal face with such crystal symmetry that semiconductive silicon having piezoresistive properties can be grown epitaxially on said face,
    means for supporting said crystal for deformation of said face in response to a force to be measured,
    and a piezoresistive silicon strain gage comprising a four-arm piezoresistive bridge in monocrystalline form molecularly integrated directly with said single crystal face,
    the crystal axes of said bridge arms being so oriented with respect to said crystal deformation that all four arms of the bridge contribute additively to the bridge output.

2. Force transducer according to claim 1 wherein said single crystal comprises a diaphragm, said supporting means rigidly supports the diaphragm peripherally for central deformation in response to transverse pressure application, and the crystal axes of said monocrystalline silicon strain gage are oriented in accordance with the crystal symmetry of said single crystal face.

3. Force transducer according to claim 1 wherein the semiconductive material forming said strain gage has a thickness less than about 10 microns.

4. Force transducer comprising
    a single crystal of aluminum oxide having a mounting surface and having a crystal face which has selected crystal symmetry and is deformable relative to said mounting surface in response to a force to be measured,
    a piezoresistive strain gage of monocrystalline silicon molecularly integrated directly with said crystal face and responsive to deformation thereof,
    a unitary, effectively rigid ceramic mounting member of high dielectric constant having a surface which mates with said crystal mounting surface,
    and a layer of glass interposed in directly sealed relation between said crystal mounting surface and the ceramic surface,
    the aluminum oxide single crystal, the ceramic mounting member and the glass sealing layer having respective thermal coefficients of expansion which are all substantially equal.

5. Force transducer according to claim 4 wherein said ceramic mounting member consists essentially of alumina.

6. Force transducer according to claim 4 wherein said single crystal has the form of a pressure responsive diaphragm, said single crystal mounting surface comprises the peripheral portion of a face of the diaphragm, and said ceramic mounting member is non-permeable and has a recess surrounded by a plane annular surface that includes said surface which mates with said crystal mounting surface.

7. Force transducer according to claim 6 wherein said strain gage includes electrical connection pads of silicon, a layer of platinum-silicon alloy directly contacting the silicon of each said pad, a layer of platinum directly contacting the alloy and spaced thereby from the silicon, and a platinum conductive element having a surface portion molecularly integrated with the platinum layer.

8. Force transducer according to claim 6 wherein said ceramic mounting member includes
    a cylindrical boss formed on the side thereof opposite said annular surface and coaxial therewith,
    a metallic ring including a thin-walled tubular portion enclosing the ceramic boss, and
    a silver band bonded directly to said tubular portion of the ring and to the ceramic boss and forming a hermetic seal therebetween.

9. Force transducer according to claim 8 wherein said ring consists essentially of a metal having a thermal coefficient of expansion such that the ring increases in diameter appreciably more than the ceramic boss in response to temperature change from room temperature to the melting temperature of silver.

10. Force transducer according to claim 8 wherein said glass layer has a melting temperature between about 800° and about 850° C.

11. Force transducer comprising
    a single crystal of aluminum oxide having a crystal face with selected crystal symmetry,
    means for supporting said crystal for deformation of said face in response to a force to be measured, and
    a piezoresistive strain gage of monocrystalline silicon molecularly integrated directly with said crystal face and responsive to deformation thereof, said crystal supporting means comprising a unitary mounting member of alumina having a first surface which mates with a mounting surface of said single crystal and a second surface which is generally cylindrical, a layer of glass interposed in directly sealed relation between said mounting surface of the single crystal and said first alumina surface, and a metallic support member including a thin-walled tubular portion enclosing said second alumina surface and directly sealed thereto by a layer of silver.

12. Force transducer according to claim 11 wherein said single crystal, said mounting member and said glass layer have respective thermal coefficients of expansion which are substantially equal.

* * * * *